United States Patent [19]
Akiyama et al.

[11] Patent Number: 5,712,494
[45] Date of Patent: Jan. 27, 1998

[54] A THIN FILM FIELD EFFECT TRANSISTOR HAVING AN EXTENSION PORTION ACTING AS A LIGHT SHIELD AND BACK GATE

[75] Inventors: Masahiko Akiyama, Tokyo; Yoshimi Ikeda, Yokohama; Toshiya Kiyota, Tokyo, all of Japan

[73] Assignee: Kabushiki Kaisha Toshiba, Kawasaki, Japan

[21] Appl. No.: 618,305

[22] Filed: Mar. 18, 1996

[30] Foreign Application Priority Data

Mar. 22, 1995 [JP] Japan .................. 7-062237

[51] Int. Cl.⁶ .......................... H01L 29/04
[52] U.S. Cl. .................. 257/59; 257/72; 257/294; 349/43
[58] Field of Search ................ 257/57, 59, 66, 257/72, 349, 294; 359/59; 349/43

[56] References Cited

U.S. PATENT DOCUMENTS 5,471,330  11/1995  Sarma ........................... 257/59
5,614,731  3/1997  Uchikoga et al. ............... 257/59

FOREIGN PATENT DOCUMENTS 63-158875  7/1988  Japan.

Primary Examiner—Minh-loan Tran
Attorney, Agent, or Firm—Oblon, Spivak, McClelland, Maier & Neustadt, P.C.

[57] ABSTRACT

A thin film field effect transistor has a hate electrode formed on a glass substrate and a gate insulation film. A channel region, formed of a semiconductor layer, is provided to be opposite to the gate electrode through the gate insulation film, and a pair of source/drain regions, formed of a n-type semiconductor layer, is provided to sandwich the channel region therebetween. An insulation channel protection layer is formed on the channel region. A silicide layer is formed on the source/drain regions, and source/drain electrodes comes in contact therewith. The drain electrode of the source/drain electrodes has an electrode extension portion extending onto the channel protection layer, and being opposite to the channel region through the channel protection layer.

17 Claims, 6 Drawing Sheets

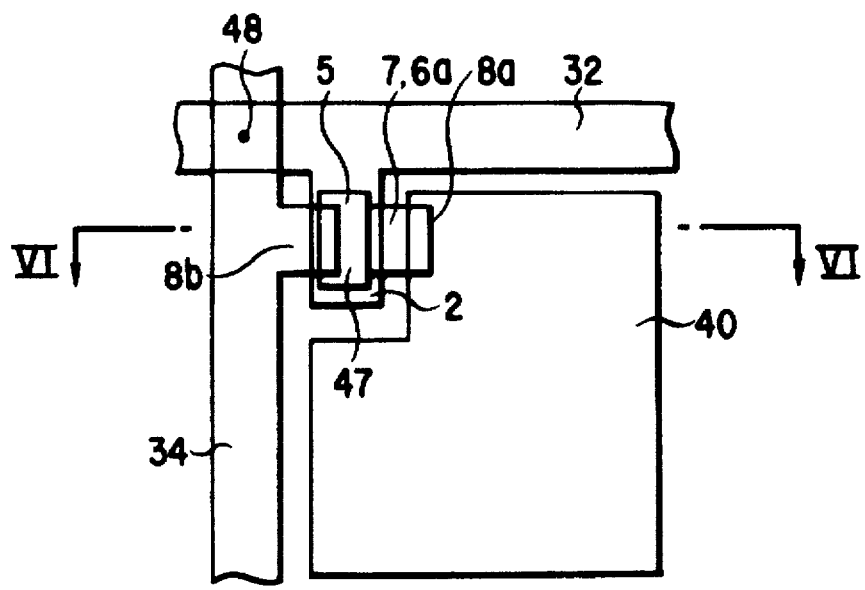
F I G. 5
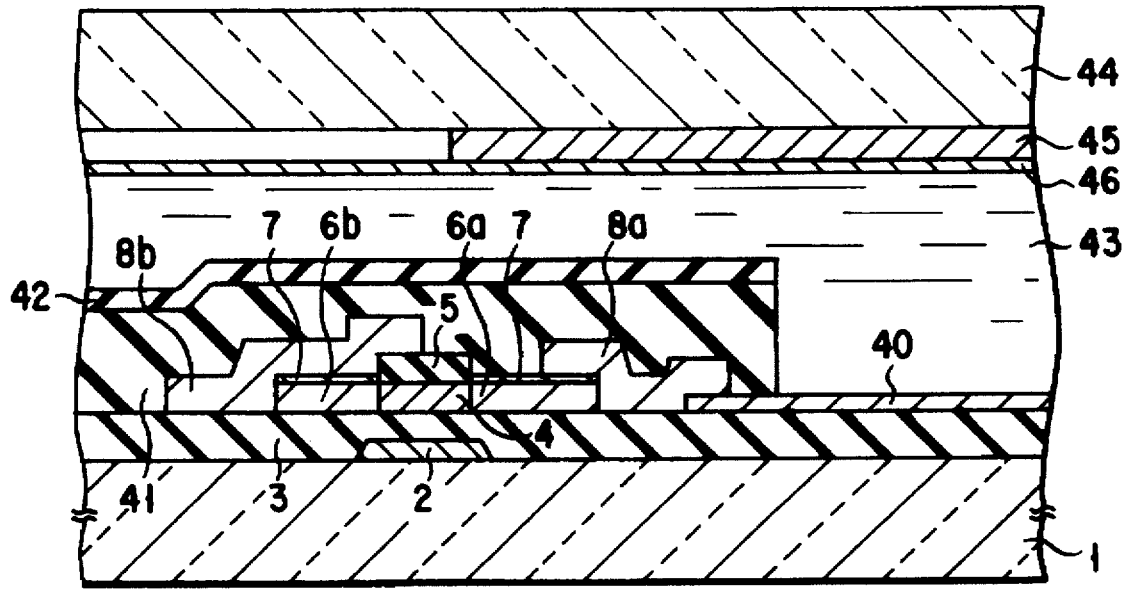
F I G. 6

A THIN FILM FIELD EFFECT TRANSISTOR HAVING AN EXTENSION PORTION ACTING AS A LIGHT SHIELD AND BACK GATE

BACKGROUND OF THE INVENTION

1. Field of the Invention

The present invention relates to a thin film field effect transistor and a liquid crystal display device using the thin film field effect transistor.

2. Description of the Related Art

In recent years, attention has been paid to a liquid crystal display device (LCD) of an active matrix system using a thin film field effect transistor (TFT). This type of the liquid crystal display device has merits in that an amount of crosstalk is small so that a contrast ratio of 100 or more can be obtained, and quality of image corresponding to CRT such as a static image display can be obtained. However, in this type of the liquid crystal display device, improvement of quality of image, an increase in the number of pixels, and an enlargement of a screen size have been required.

FIG. 12 is a cross sectional view showing a conventional TFT structure of self-aligning type disclosed in Japanese patent Application KOKAI No. 1-183854. As shown in FIG. 12, a gate 2 is provided on a glass substrate 1, and a gate insulation film 3 is layered thereon. Further, an amorphous silicon (a-Si) layer, serving as a channel region 4, is layered thereon to correspond to the gate electrode 2. Also, n+a-Si layers, serving source/drain regions 6, respectively, are formed at both side portions adjacent to the channel region 4. A silicide layer 7, which is obtained by reacting a metal with silicon, is formed on each of the source/drain regions 6, and source/drain electrodes 8a and 8b are formed thereon. Further, a channel protection layer 5 is formed thereon.

As a result of estimating electric characteristics of the above-structured TFT, the following point was found out.

More specifically, leak current between the source and drain is increased due to light irradiated from above the TFT. The leak current is increased to such an extent that the voltage applied to the liquid crystal is attenuated, and display quality of, e.g., a motion image, is considerably worsened even in a case where the amount of irradiation light corresponds to that of back light of the liquid crystal display.

In other words, the conventional liquid crystal display device has a problem in which the large amount of light leak current is generated due to irradiation light from above and the display quality of, e.g., a motion image, is considerably worsened in the TFT of the self-aligning type used as a switching transistor.

SUMMARY OF THE INVENTION

An object of the present invention is to provide a thin film field effect transistor, which is operated at high speed even if a channel length is shortened and has a small amount of leak current. Also, an object of the present invention is to provide a liquid crystal display device, which prevents display quality from being worsened by use of the thin film field effect transistor.

According to a first aspect of the present invention, there is provided a thin film field effect transistor comprising:

a substrate having an insulating surface;

a gate electrode formed on the insulating surface;

a channel region, formed of a semiconductor layer, provided to be opposite to the gate electrode through a gate insulation film;

a pair of source/drain regions, formed of a semiconductor layer, provided to sandwich the channel region therebetween;

an insulating channel protection layer formed on the channel region, the channel protection layer having first and second ends opposite to the source/drain regions, respectively; and a pair of source/drain electrodes formed on the source and drain regions, wherein only one of the source/drain electrodes adjacent to the first end has an electrode extension portion passing the first end to extend onto the channel protection layer, and being opposite to the channel region through the channel protection layer.

According to a second aspect of the present invention, there is provided a liquid crystal display device, comprising:

(a) a substrate having an insulating surface;

(b) a pixel electrode formed on the insulating surface;

(c) a liquid crystal layer formed on the pixel electrode;

(d) an opposite electrode opposite to the pixel electrode through the liquid crystal layer;

(e) an opposite substrate arranged to interpose the liquid crystal layer between the substrates;

(f) a signal line for supplying an image signal to the pixel electrode;

(g) an address line for selecting a connection state between the signal line and the pixel electrode; and (h) a thin film field effect transistor turned on/off by the address line, and functioning as a switching element for changing the connection state between the signal line and the pixel electrode, the transistor comprising, a gate electrode formed on the insulating surface, and connected to the address line, a channel region, formed of a semiconductor layer, provided to be opposite to the gate electrode through a gate insulation film, a pair of source/drain regions, formed of a semiconductor layer, provided to sandwich the channel region therebetween, an insulating channel protection layer formed on the channel region, the channel protection layer having first and second ends opposite to the source/drain regions, respectively, and a pair of source/drain electrodes formed on the source and drain regions, one of the source/drain electrodes being connected to the signal line, the other being connected to the pixel electrode, wherein only one of the source/drain electrodes adjacent to the first end has an electrode extension portion passing the first end to extend onto the channel protection layer, and being opposite to the channel region through the channel protection layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 5 and 6 are a schematic plane view of a liquid crystal display device using the TFT shown in FIGS. 1A to 1D and 2, and a cross sectional view taken along line VI—VI of FIG. 5, respectively;

DETAILED DESCRIPTION OF THE PREFERRED EMBODIMENTS

Figure 1A:
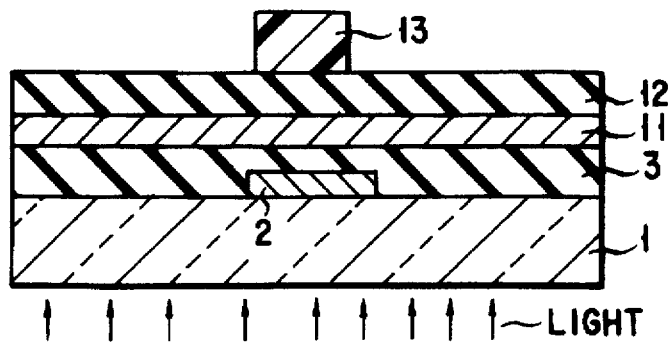
FIGS. 1A to 1D are cross sectional views showing manufacturing steps of a TFT according to an embodiment of the present invention in order.
Figure 1B:
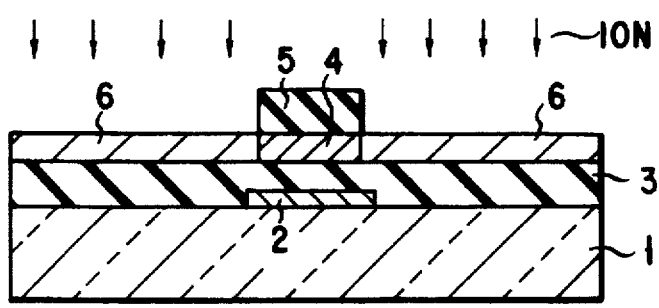
Figure 1C:
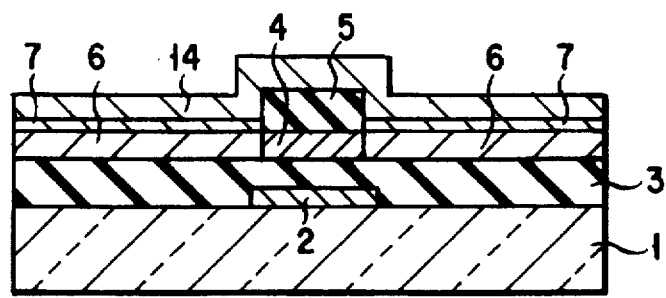
Figure 1D:
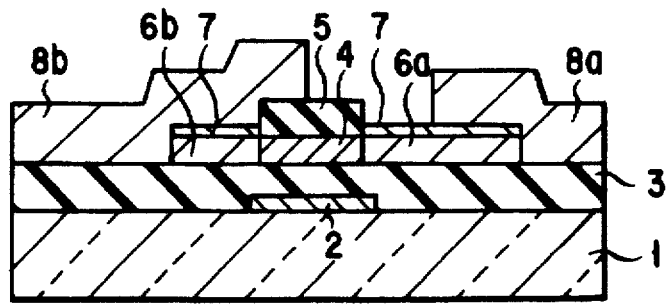
Figure 2:
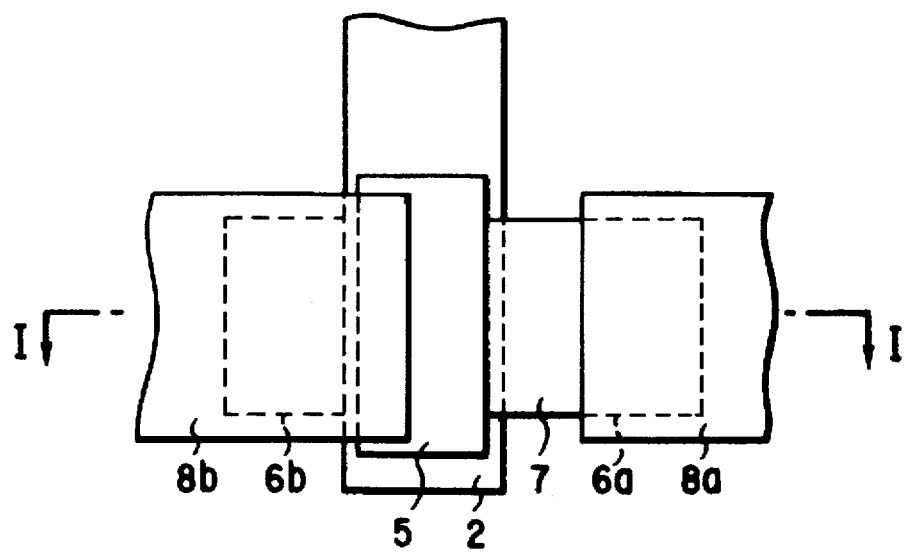
FIG. 2 is a plane view of the TFT shown in FIGS. 1A to 1D.

FIGS. 1A to 1D are cross sectional views showing manufacturing steps of a TFT according to an embodiment of the present invention in order, and FIG. 2 is a plane view of the TFT. FIGS. 1A to 1D correspond to cross sections taken along line I—I of FIG. 2.

In the TFT of this embodiment, a gate electrode 2, which is made of an MoTa alloy, is formed on a glass substrate 1 by magnetron sputtering. As a material to be used as the gage electrode 2, metals such as Al, Mo, W, Ti, a material formed by layering these metals, or an alloy of these metals can be used. It is also possible to use another electrode in which Al is patterned, and a pattern of a conductive material such as MoTa is formed so as to cover the patterned Al. Moreover, an undercoat film, which is made of an insulation film such as silicon oxide, may be formed on a surface of the glass substrate 1 before forming the gate electrode.

Next, a gate insulation film 3 is formed on the glass substrate 1 by CVD. The gate insulation film 3 is made of silicon oxide having a thickness of 350 nm and silicon nitride having a thickness of 50 nm. Also, an a-Si film 11 having a thickness of 50 nm, serving as an active layer, is formed on the gate insulation film 3 by CVD. Moreover, a silicon nitride film 12 having a thickness of 400 nm is formed on the a—Si film 11 by CVD so as to form a channel protection layer 5. A thickness of the channel protection layer 5 can be varied in the range of about 200 nm to 500 nm. The gate insulation film 3 may be a single layer of the silicon nitride film, or include a metal oxide film such as a tantalum oxide film, or use a layered film including a film, which is obtained by anodizing the gate electrode 2.

Next, the silicon nitride film 12 is coated with positive photoresist, and irradiated with ultraviolet rays from the back surface of the substrate to be exposed and developed. Thereby, a resist pattern 13 having substantially the same width as the gate electrode 2 is formed (FIG. 1A). In this embodiment, an end portion of the channel protection layer 5, which is perpendicular to line I—I of FIG. 2, is determined by a normal mask exposure before the development. It is noted that the resist pattern 13 may be formed by only the mask exposure without using the back surface exposure. In this case, it is required that an aligning margin be taken based on accuracy of mask aligning with the gate electrode 2. However, such a case can be put to practical use by depending on the use.

Next, the silicon nitride film 12 is patterned by etching so as to form the channel protection layer 5. Then, the channel protection layer 5 is used as a mask, and the a-Si film 11 is doped with an impurity, thereby forming a source/drain region 6. In this case, a region, which is not doped with the impurity of the a—Si film 11, serves as a channel region 4 (FIG. 1B). For forming an n-type TFT, phosphorus may be used as the impurity. In this embodiment, 5% phosphine (PH$_3$) gas diluted with hydrogen gas was discharge-decomposed to generate an ion such as PHx$^+$. Then, the ion was accelerated toward the substrate to be implanted in a state that the channel protection layer 5 was used as a mask. An accelerating voltage was 30 kV, and an amount of ion dose was $1 \times 10^{16}$/cm$^2$. In this case, the conditions of the ion implantation can be changed in the range of concentration of phosphine (PH$_3$) gas of 1 to 20%, the accelerating voltage of 20 to 40 kV, and the amount of ion dose of $1 \times 10^{15}$/cm$^2$ to $1 \times 10^{17}$/cm$^2$. An annealing temperature can be ranged in the range of 200° to 300° C.

Next, in order to silicide the silicon surface, the surface is washed with dilute hydrofluoric acid, and sputtered with Mo, thereby forming a silicide layer 7. In this case, in order to avoid the shortage of Mo, the surface is sputtered with excessive Mo, and a Mo layer 14 is formed on the silicide layer 7 (FIG. 1C). It is possible to use a method, such as a dry cleaning with SF$_6$+H$_2$O, as a pretreatment for forming a silicide, in order to remove a natural oxide film on the surface, other than the method using the dilute hydrofluoric acid.

The silicide layer 7 functions as a coating layer and a contact layer of the source/drain region 6. In this embodiment, Mo was used to form the silicide layer 7. However, the other metals such as Cr, W, Ti, Pd, Ni, Co, or an alloy of these metals can be used. Moreover, after the film formation, the metal layer for forming the silicide layer 7 may be annealed at 200° C. to 300° C., or the temperature of the film formation may be increased.

Then, the semiconductor layers 6 and 7 are patterned to be an island shape. In this patterning, the resist pattern for determining the island shape is formed to be narrower than the width of the channel protection layer 5 in a direction perpendicular to the line I—I of FIG. 2. There can be used, for example, reactive ion etching (RIE) containing chlorine gas, which provides selectivity between the channel protection layer 5 and the silicon film. Or, the channel protection layer 5 can be simultaneously etched at the time of the patterning.

Next, the Mo layer 14 left under unreaction is removed by etching. Thereafter, source/drain electrodes 8a and 8b, which are made of the layered Mo layer and Al layer, are formed so as to be connected to the semiconductor layer 6 and the silicide layer 7 which constitute the source/drain regions. In this case, the patterning is performed such that one electrode is overlapped with the channel region 4 through the insulation channel protection layer 5 (FIG. 1D). Thereby, the TFT is completed.

In this embodiment, the drain electrode 8b (serving as a drain side in consideration of the flow of the carrier when the TFT is n-type) was overlapped with the channel region 4 through the insulation channel protection layer 5. In this case, seeing from the upper surface, the drain region 6b was completely coated. Also, the top end portion of the drain electrode 8b was set back by the margin of 1 μm to 3 μm from the end of the channel protection layer 5 on the source region 6a side. Therefore, the length of overlapping was 2 μm to 4 μm relative to the channel region 4 of 5 μm to 6 μm. The set-back margin of the drain electrode 8b is provided to prevent the circuit from being short-circuited based on the error of the mask aligning. Therefore, the drain electrode 8b may be overlapped with the entire of the channel region 4, if possible, Moreover, the source/drain regions 6 and 7 and the channel region 4 are formed of the same non-crystalline Si film 11. However, these three layers are brought into contact with each other to be electrically connected to each other after forming the different semiconductor film. As an electrode, there may used materials showing conductivity other than Mo/Al. For example, such an electrode may be formed of an indium tin oxide film (ITO) at the same time when a pixel electrode is formed.

The doping method to be used at the time of forming the source/drain regions is not limited to the above-mentioned method. For example, the normal ion implantation for a mass separation may be used, or a simple mass separation in which only a hydrogen ion is removed may be used. Moreover, there can be used the method in which the temperature of the substrate is set to 200° C. to 300° C. to be activated at the time of the ion radiation. Or, there can be used a method of diffusely doping from the impurity source in contact with the silicon surface, by laser irradiation. Moreover, an annealing step for activation may be performed with another annealing step in common or with other annealing steps in common at last, without being performed just after the doping.

The doping can be performed after the formation of silicide. Thereby, contact resistance between the silicide and the n-type semiconductor layer can be reduced.

Moreover, a thin metal layer having light transmission or an ITO transparent conductive film can be used in place of the silicide layer. In this case, for example, first, the thin metal layer or the ITO transparent conductive film is formed on the silicon surface. Then, a negative resist is applied to the formed layer or film, and exposed and developed by the back surface exposure, thereby forming a mask. Then, by the formed mask, the metal layer or the transparent conductive film formed on the upper insulation film is etched to be removed, or processed by lift off. The metal layer or the transparent conductive film may be slightly overlapped with the upper insulation film.

Figure 3:
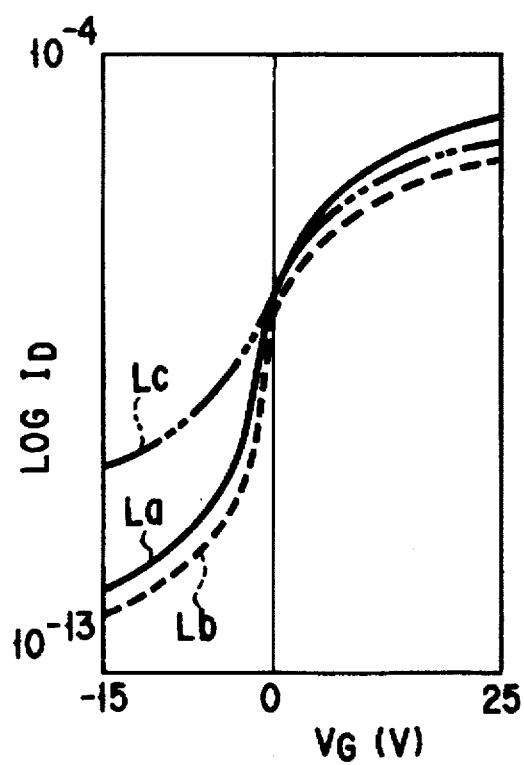
FIG. 3 is a graph showing gate voltage —drain current characteristics, at the time of light irradiation, of each of the TFT according to the embodiment of the present invention and TFTs of comparison.

The light leak current of the above-structured TFT is reduced down to about one fifth that of the conventional TFT where both sides are not overlapped with the channel region. FIG. 3 shows a result of experiments conducted in relation to the above described advantage.

Figure 4A:
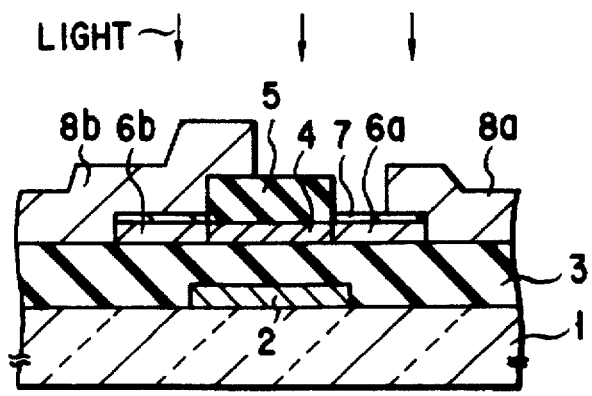
FIGS. 4A to 4C are schematic cross sectional views each showing the structure of the TFT whose characteristics are shown in FIG. 3.
Figure 4B:
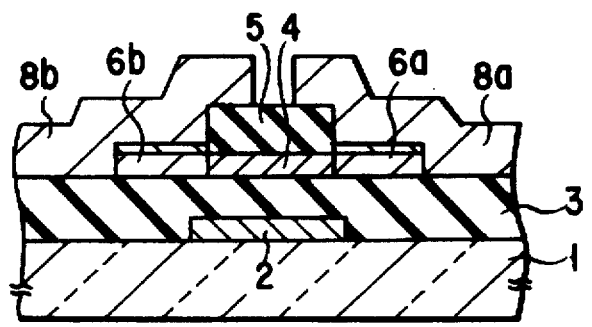
Figure 4C:
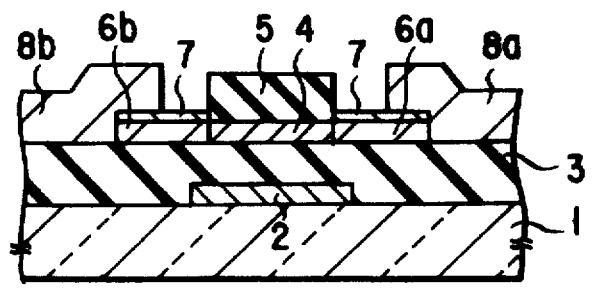

In FIG. 3, a solid line La, a broken line Lb, and one-dotted chain line Lc show gate voltage $V_G$ - drain current $I_D$ characteristics at the time of light irradiation in the TFTs shown in FIGS. 4A to 4C. More specifically, FIG. 4A shows the TFT of the present invention in which only the drain electrode 8b is overlapped with the channel region 4, FIG. 4B shows a TFT as a comparison in which both source/drain electrodes 8a and 8b overlapped with the channel region 4, and FIG. 4C shows a TFT as a comparison in which both source/drain electrodes 8a and 8b are not overlapped with the channel region 4.

As shown in FIG. 3, regarding the current (leak current) in an off-state that the gate voltage is negative, the amount of the leak current of the TFT shown in FIG. 4B is the smallest. In the TFT of FIG. 4A of the present invention, the amount of the leak current is increased two to three times larger than the TFT shown in FIG. 4B. However, the amount of the leak current is decreased to about ¼ or less as compared with the TFT shown in FIG. 4C.

Regarding the current (drain current) in an on-state that the gate voltage is positive, the amount of the drain current of the TFT of the present invention shown in FIG. 4A is the largest. This is because the overlap portion of the drain electrode 8b, which is opposite to the channel region 4 through the channel protection layer 5, functions as a back gate.

In other words, in the TFT shown in FIG. 4A, similar to the normal TFT, a main inversion layer is formed in the lower side surface of the channel region 4 by a potential of the gate electrode 2. Moreover, in the state that the TFT is turned on, if voltage is applied between the source and drain such that the drain electrode 8b becomes positive and the source electrode 8a becomes negative, a second inversion layer is formed in the upper side surface of the channel region 4 by a potential of the overlap portion of the drain electrode 8b. Due to this, the current can flow both the main and second inversion layers. Therefore, in the state that the TFT is turned on, resistance of the channel region 4 is reduced, and the large amount of current can be obtained.

The TFT shown in FIGS. 1A to 1D and 2 can be applied to a liquid crystal display device of an active matrix type as shown in FIG. 5. FIG. 5 shows a plane view of one pixel of the liquid crystal display device of the active matrix type. A plurality of such pixels is formed on the substrate in a matrix format. FIG. 6 is a cross sectional view taken along line VI—VI of FIG. 5.

In FIGS. 5 and 6, a pixel electrode 40 and a TFT 47 functioning as a switching element are formed in the vicinity of a crossing point 48 between an address line 32 and a signal line 34. In this case, the address line 32 and the gate electrode. 2 are integrally formed, and the signal line 34 and the drain electrode 8b are integrally formed. A pixel electrode 40, made of ITO, a passivation film 41, and a light shielding layer 42 are arranged on the glass substrate 1, thereby forming an array substrate. An opposite substrate, which comprises a glass substrate 44, a color filter 45, and an opposite electrode 46, is arranged to be opposite to the array substrate through a liquid crystal layer 43. In this case, an opposite black matrix layer may be added to the above-mentioned structure.

In the liquid crystal display device having the n-type TFT, it is assumed that the opposite electrode is fixed to an intermediate potential Vm and a signal is written to the pixel electrode from the signal line by the potential of Vm±α in an alternate manner. In the case where the signal is written by Vm±α, the potential of the pixel electrode gradually rises and reaches close to the potential of the gate electrode. Due to this, the potential difference between the source and gate gradually becomes smaller, and on-current is gradually decreased, so that much time is needed as compared with the case when the signal writing is performed by Vm−α.

However, in the liquid crystal display device of FIGS. 5 and 6, a large amount of on-current of the TFT 47 can be obtained with the help of the drain electrode 8b serving as a back gate when the signal writing is performed by Vm+α. Since charging time to the pixel electrode 40 is reduced, the number of scanning lines can be increased and high fidelity images can be displayed. Furthermore, with a decrease in charging time to the pixel electrode 40, the display of the motion image can be made clear at high speed, so that the display performance of the motion image can be improved.

Figure 7:
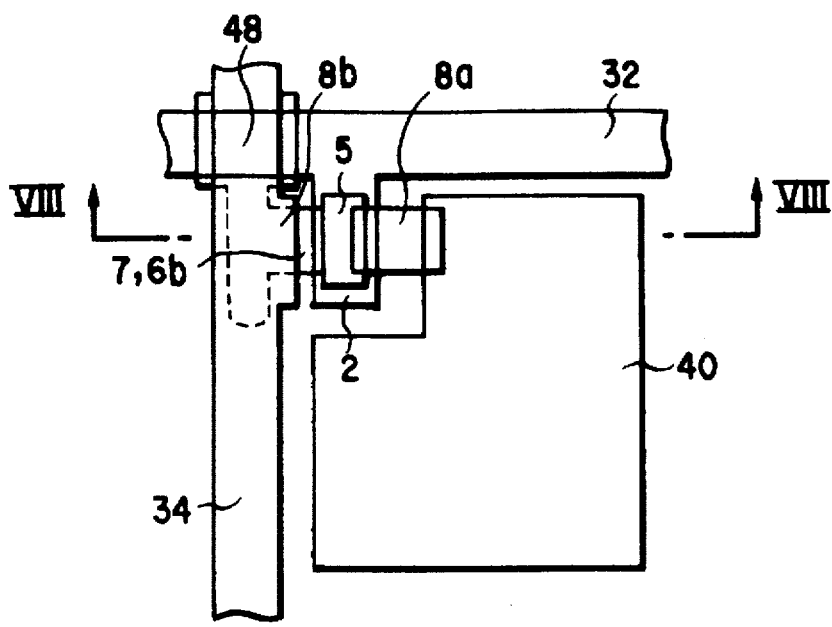
FIGS. 7 and 8 are a schematic plane view of a liquid crystal display device using a TFT according to another embodiment, and a cross sectional view taken along line VIII—VIII of FIG. 7, respectively.
Figure 8:
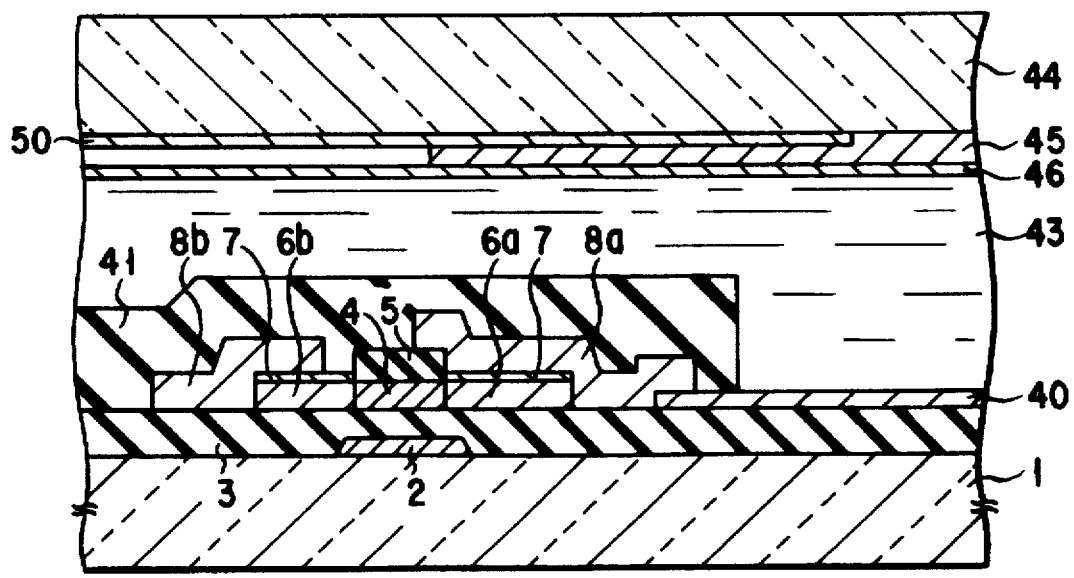

FIG. 7 is a plane view showing a liquid crystal display device having a TFT according to another embodiment of the present invention. FIG. 7 shows a plane view of one pixel of the liquid crystal display device of the active matrix type. A plurality of such pixels is formed on the substrate in a matrix format. FIG. 8 is a cross sectional view taken along line VIII—VIII of FIG. 7.

The liquid crystal display device of FIGS. 7 and 8 is different from that of FIGS. 5 and 6 in the following points.

More specifically, the source electrode 8a of the TFT (source/drain electrode on the pixel electrode 40 side) is overlapped with the channel region 4. Also, a black matrix layer 50 is added onto the opposite glass substrate 44. Due to this, no light shielding layer 42 is not particularly needed.

The liquid crystal display device of FIGS. 7 and 8 has merits in the point that the amount of the leak current of a TFT under practical driving conditions is reduced as compared with the liquid crystal display device of FIGS. 5 and 6, so that an electric charge holding can be improved. This is due to a phenomenon in which a number of pulses is reduced, thereby the potential of the pixel electrode is decreased. The voltage, which is applied between the source and drain in the holding state (off-state of TFT), is increased in a case where the potential of the pixel electrode becomes negative to the potential of the opposite electrode. This is because, in this case, when the gate electrode potential is a low level (or the TFT becomes off-state), the potential of pixel electrode further decreases, so that the potential difference between the pixel electrode and signal line, or between the source and drain becomes larger than that in the case of Vm+α. In this state, the leak current is prevented by the junction reversely biased on the source region 6a side. Where the source electrode 8a is overlapped with the channel region 4, the source region 6a is prevented from being irradiated with light, and the leak current can be prevented from being increased.

An explanation will be given as to why the leak current is decreased.

As explained in FIGS. 1A to FIG. 8, according to the present invention, one of the source/drain electrodes 8a and 8b is overlapped with the channel region 4 through the channel protection layer 5. As a result, the electric field of the horizontal direction of the upper portion of the channel region 4 contacting the source and drain region 6 becomes smaller than the potential of the source and drain electrodes 8a and 8b. Due to this, pairs of electron - hole, which are generated by light irradiation, are not easily separated from each other. Then, the electrons and holes are easily recombined with other, and less carrier serving as leak current is generated. In addition, where the metallic electrode having shielding characteristics is used, light carriers are hardly generated in the channel region 4 under the electrodes 8a and 8b, so that a region having a high resistance is formed and leak current is reduced.

As shown in FIGS. 5 and 6, where the drain electrode 8b is overlapped with the channel region 4, the on-current of the TFT is increased. Furthermore, in general, when impurity ions are accelerated for doping, there is generated a phenomenon in which the ions are implanted to the upper insulation film so that the film is positively charged. Due to this, Fermi level of the semiconductor layer approaches a conduction band, so that light current is increased. However, where the drain electrode 8b is overlapped with the channel region 4, the potential of the upper insulation film is reduced, so that the change of Fermi level of the semiconductor is suppressed, and the light current is reduced.

On the other hand, as shown in FIGS. 7 and 8, where the source electrode 8a is overlapped with the channel region 4, the leak current is smaller as compared with the case where the drain electrode 8b is overlapped with the channel region 4. In other words, the potential of the pixel electrode is less changed where the source electrode is connected to the pixel electrode.

Figure 9:
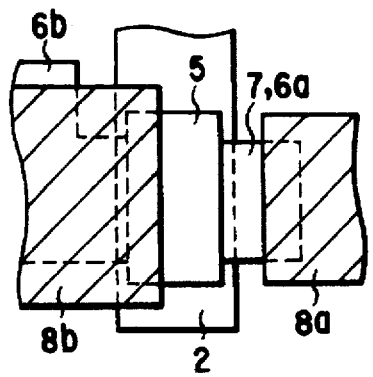
FIGS. 9, 10, and 11 are plane views each showing a TFT according to still another embodiment.

FIG. 9 is a plane view showing TFT according to still another embodiment of the present invention. The TFT of this embodiment differs from that of FIGS. 1A to 1D and 2 in that the width of the drain electrode 8b, which is overlapped with the channel protection layer 5, is larger than the width of the channel protection layer 5. In such a TFT, there is an advantage in which light leak current is reduced in addition to the above-mentioned advantages since a region shielding the upper insulation film is increased.

Figure 10:
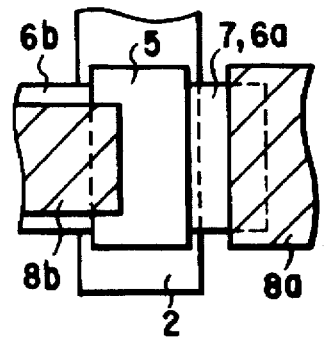

FIG. 10 is a plane view showing TFT according to still another embodiment of the present invention. The TFT of this embodiment differs from that of FIGS. 1A to 1D and 2 in that the width of the drain electrode 8b, which is overlapped with the channel protection layer 5, is smaller than the width of the a—Si drain region 6b. In such a TFT, there is an advantage in which the dark leak current due to the hole current can be reduced in addition to the above-mentioned advantage, since the drain electrode 8b does not directly contact the side surface of the channel region 4. In this TFT, however, the light leak current under a strong illumination is slightly increased.

Figure 11:
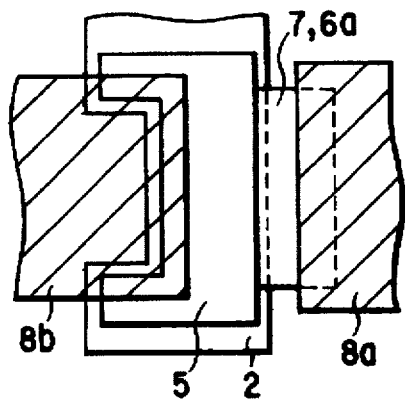
Figure 12:
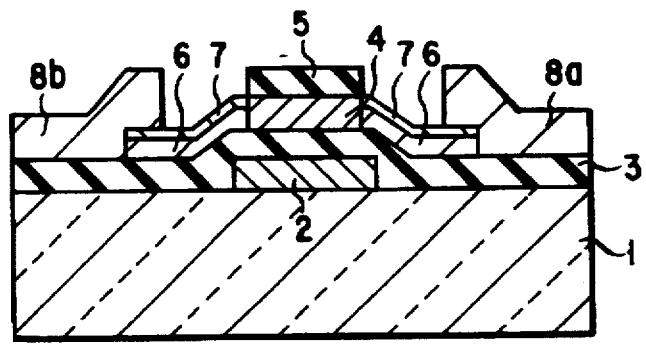
FIG. 12 is a cross sectional view showing a conventional TFT.

FIG. 11 is a plane view showing TFT according to still another embodiment of the present invention. The TFT of this embodiment differs from that of FIGS. 1A to 1D and 2 in that the channel protection layer 5 is U-shaped, and that the width of the source electrode 8a is larger than that of the drain electrode 8b. In such a TFT, there is an advantage in which the resistance of a bypass formed by the side surface of the channel region 4 is increased so that the off-resistance is increased, in addition to the above-mentioned advantage, since the peripheral length of the channel protection layer 5 can be increased. This is particularly useful to the case where the side surface of the channel region 4 is slightly silicided by the step of forming the source/drain electrodes 8a and 8b, thereby reducing the resistance.

In the above-mentioned embodiments, non-crystalline Si film is used as a semiconductor film. However, a micro-crystalline film or a poly-crystalline film may be used. Also, it is possible to use IV group semiconductor other than Si, such as Ge, or a compound semiconductor, such as SiGe. Moreover, a silicon nitride film, serving as a passivation film, may be formed overall on a TFT. Furthermore, an organic or inorganic black matrix layer for light shielding may be formed on the passivation film. Also, there may be used a substrate whose surface is insulating, such as an SOI substrate other than the glass substrate. Although the above-mentioned embodiments employ an n-type TFT, the present invention can be applied to a p-type TFT.

As mentioned above, according to the present invention, there can be provide a thin film field effect transistor, which is operated at high speed even if a channel length is shortened and has a small amount of leak current. Also, there can be provided a liquid crystal display device, which prevents display quality from being worsened, by use of the thin film field effect transistor.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A thin film field effect transistor for a display device, comprising:

a substrate having an insulating surface;

a gate electrode formed on said insulating surface;

a channel region, formed of a semiconductor layer, provided to be opposite to said gate electrode through a gate insulation film;

a pair of source/drain regions, formed of a semiconductor layer, provided to sandwich said channel region therebetween;

an insulating channel protection layer formed on said channel region, said channel protection layer having first and second ends opposite to said source/drain regions, respectively; and a pair of electrodes formed on said source and drain regions to provide a source electrode and a drain electrode, wherein said drain electrode is located adjacent to said first end and has an electrode extension portion passing said first end to be arranged directly on said channel protection layer opposite to said channel region through said channel protection layer, said extension portion reducing leakage current by providing a light shielding function and functioning as a back gate in an on state of the transistor to increase on current flow in the channel region.

2. The transistor according to claim 1, wherein a distal end of said electrode extension portion is separated from said second end of said channel protection layer, and is terminated on said channel protection layer.

3. The transistor according to claim 2, wherein a distal end of the source electrode is opposite to said second end of said channel protection layer and does not pass said second end.

4. The transistor according to claim 3, wherein a surface of said source/drain regions is coated with a coating layer formed of an alloy of a metal and a semiconductor between said distal end of said source electrode and said second end of said channel protection layer.

5. The transistor according to claim 4, wherein a contact layer, formed of an alloy of a metal and a semiconductor, is formed between each of said source/drain regions and each of said source and drain electrodes, and said coating layer and one of said contact layers are integrally formed.

6. The transistor according to claim 5, wherein said semiconductor layer, constituting said source/drain regions, is formed of silicon, and said coating layer and contact layers are formed of metallic silicide.

7. The transistor according to claim 6, wherein said semiconductor layer, constituting said channel region and said source/drain regions, is formed from a single semiconductor film.

8. A liquid crystal display device, comprising:

(a) a substrate having an insulating surface;

(b) a pixel electrode formed on said insulating surface;

(c) a liquid crystal layer formed on said pixel electrode;

(d) an opposite electrode opposite to said pixel electrode through said liquid crystal layer;

(e) an opposite substrate arranged to interpose said liquid crystal layer between said substrates;

(f) a signal line for supplying an image signal to said pixel electrode;

(g) an address line for selecting a connection state between said signal line and said pixel electrode; and (h) a thin film field effect transistor turned on/off by said address line, and functioning as a switching element for changing the connection state between said signal line and said pixel electrode, said transistor comprising, a gate electrode formed on said insulating surface, and connected to said address line, a channel region, formed of a semiconductor layer, provided to be opposite to said gate electrode through a gate insulation film, a pair of source/drain regions, formed of a semiconductor layer, provided to sandwich said channel region therebetween, an insulating channel protection layer formed on said channel region, said channel protection layer having first and second ends opposite layer having first and second ends opposite to said source/drain regions, respectively, and a pair of source/drain electrodes formed on said source and drain regions, one of said source/drain electrodes being connected to said signal line, the other being connected to said pixel electrode, wherein only said one electrode connected to the signal line is located adjacent to said first end and has an electrode extension portion passing said first end to be arranged directly on said channel protection layer opposite to said channel region through said channel protection layer, said extension portion reducing leakage current by providing a light shielding function and functioning as a back gate in an on state of the transistor to increase on current flow in the channel region.

9. The device according to claim 8, wherein a distal end of said electrode extension portion is separated from said second end of said channel protection layer, and is terminated on said channel protection layer.

10. The device according to claim 9, wherein a distal end of the other of said source/drain electrodes connected to said pixel electrode is opposite to said second end of said channel protection layer and does not pass said second end.

11. The device according to claim 10, wherein a surface of said source/drain regions is coated with a coating layer formed of an alloy of a metal and a semiconductor between said distal end of said other electrode and said second end of said channel protection layer.

12. The device according to claim 11, wherein a contact layer, formed of an alloy of a metal and a semiconductor, is formed between each of said source/drain regions and each of said source/drain electrodes, and said coating layer and one of said contact layers are integrally formed.

13. The device according to claim 12, wherein said semiconductor layer, constituting said source/drain regions, is formed of silicon, and said coating layer and contact layers are formed of metallic silicide.

14. The device according to claim 13, wherein said semiconductor layer, constituting said channel region and said source/drain regions, is formed from a single semiconductor film.

15. The device according to claim 10, wherein a light shielding layer is formed to cover said transistor between said opposite substrate and said transistor.

16. The device according to claim 10, a black matrix layer formed to cover said transistor is supported by said opposite substrate.

17. The device according to claim 8, wherein said source/drain region has an n-conductive type.

* * * * *